(12) United States Patent
Meyer

(10) Patent No.: US 10,340,411 B2
(45) Date of Patent: Jul. 2, 2019

(54) INSTALLATION FOR TREATING A MATERIAL

(71) Applicant: Eisenmann SE, Boeblingen (DE)

(72) Inventor: Wilhelm Meyer, Nideggen (DE)

(73) Assignee: EISENMANN SE, Boeblingen (DE)

( * ) Notice: Subject to any disclaimer, the term of this patent is extended or adjusted under 35 U.S.C. 154(b) by 67 days.

(21) Appl. No.: 14/951,980

(22) Filed: Nov. 25, 2015

(65) Prior Publication Data

US 2016/0146537 A1    May 26, 2016

(30) Foreign Application Priority Data

Nov. 26, 2014  (DE) ........................ 10 2014 017 451

(51) Int. Cl.
| | |
|---|---|
| F27B 9/04 | (2006.01) |
| F27D 7/06 | (2006.01) |
| F27B 9/38 | (2006.01) |
| H01L 31/18 | (2006.01) |
| F27B 9/24 | (2006.01) |

(Continued)

(52) U.S. Cl.
CPC ............ H01L 31/18 (2013.01); F27B 9/2407 (2013.01); F27D 99/0073 (2013.01); H01L 21/6776 (2013.01); H01L 21/67706 (2013.01); F27D 2007/063 (2013.01)

(58) Field of Classification Search
CPC ........... F27D 2007/063; F27D 99/0073; H01L 21/6776; H01L 21/67706; H01L 31/18; F27B 9/2407; F27B 9/32; B21B 39/008; B21B 39/078; B21B 27/05; F16J 15/54; F16J 15/002; F16J 15/3268

USPC ........................................ 432/152, 200, 242
See application file for complete search history.

(56) References Cited

U.S. PATENT DOCUMENTS

| | | | | |
|---|---|---|---|---|
| 2,497,154 A | * | 2/1950 | Dailey, Jr. ............. | B21B 39/008 193/37 |
| 3,026,099 A | * | 3/1962 | Ipsen .................... | F27B 9/2407 198/790 |
| 5,248,349 A | | 9/1993 | Foote et al. | |

(Continued)

FOREIGN PATENT DOCUMENTS

| | | |
|---|---|---|
| DE | 693 34 189 T2 | 11/2008 |
| DE | 10 2009 019 127 A1 | 5/2011 |

(Continued)

*Primary Examiner* — Steven B McAllister
*Assistant Examiner* — Steven S Anderson, II
(74) *Attorney, Agent, or Firm* — Schroeder Intellectual Property Law Group, LLC

(57) ABSTRACT

An installation for treating material having a treatment chamber equipped with an envelope which separates a controlled atmosphere which is present in its interior from an atmosphere which is present outside the envelope and a housing which delimits the treatment chamber. At least one supporting roller for conveying the material is arranged at least partly inside the treatment chamber. One or more mounting apparatuses for mounting at least one supporting roller are arranged outside the housing. A flexible compensating element is provided between at least one mounting apparatus and a wall, which is associated with the latter, of the housing, there being provided a sealing arrangement which is connected to said compensating element and which separates the at least one mounting apparatus from the atmosphere which is present inside the envelope.

19 Claims, 5 Drawing Sheets

(51) Int. Cl.
*H01L 21/677* (2006.01)
*F27D 99/00* (2010.01)

(56) References Cited

U.S. PATENT DOCUMENTS

| | | | | |
|---|---|---|---|---|
| 5,344,164 A | * | 9/1994 | Carmody | F16J 15/3472 |
| | | | | 277/371 |
| 5,372,646 A | | 12/1994 | Foote et al. | |
| 5,470,397 A | | 11/1995 | Foote et al. | |
| 5,536,333 A | | 7/1996 | Foote et al. | |
| 6,471,394 B2 | * | 10/2002 | Kesig | B01F 7/02 |
| | | | | 366/331 |
| 2015/0204446 A1 | * | 7/2015 | Negra | F16J 15/187 |
| | | | | 277/375 |

FOREIGN PATENT DOCUMENTS

| | | | |
|---|---|---|---|
| DE | 10 2011 116 136 A1 | 4/2013 | |
| DE | 10 2012 011 928 B3 | 7/2013 | |
| JP | 2006237161 A * | 9/2006 | |
| WO | 2010/124781 A2 | 11/2010 | |
| WO | WO 2014013048 A1 * | 1/2014 | F16J 15/187 |

* cited by examiner

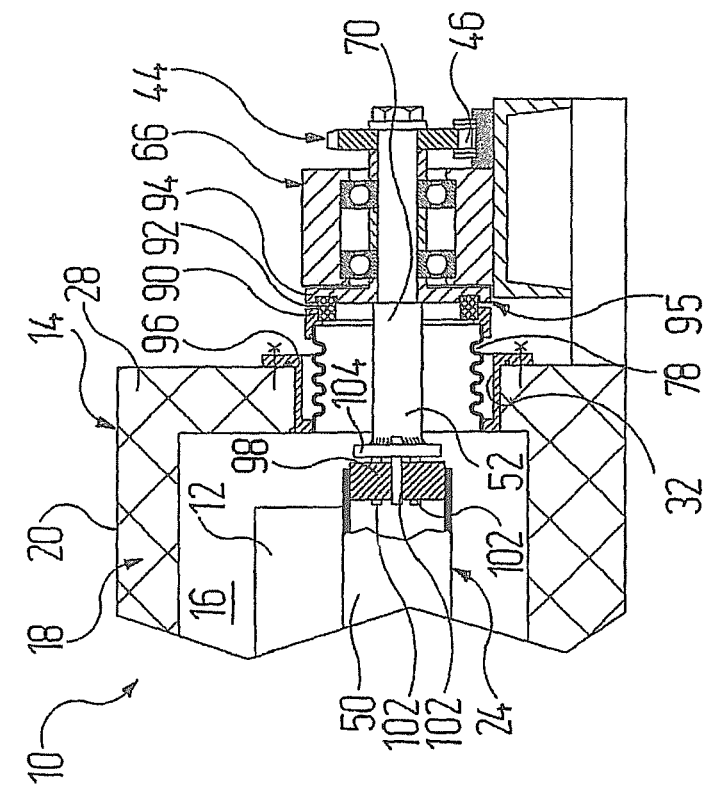
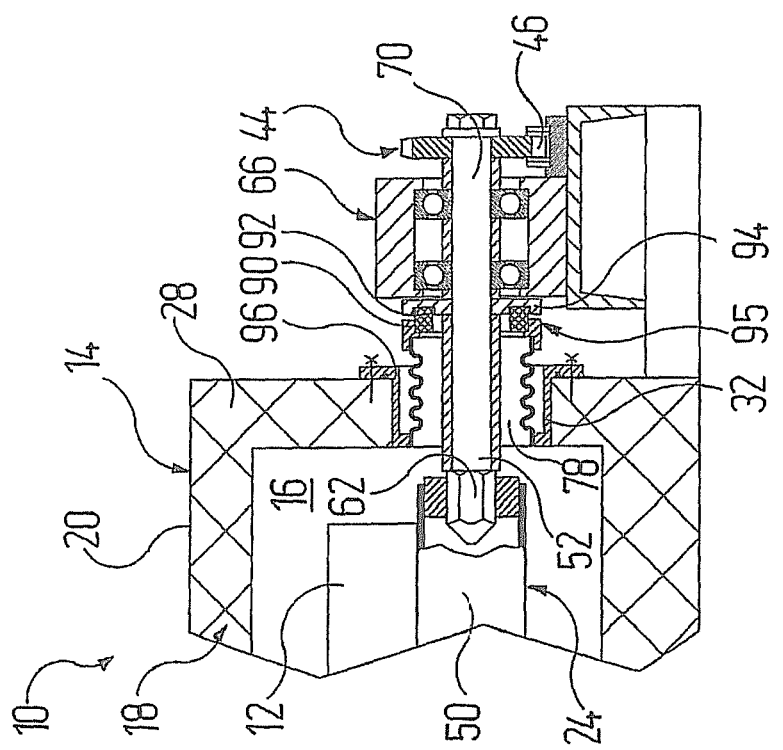

INSTALLATION FOR TREATING A MATERIAL

CROSS-REFERENCE TO RELATED APPLICATIONS

The present application claims benefit of German patent application no. 10 2014 017 451.4 filed Nov. 26, 2014—the full disclosure of this application is incorporated herein by reference.

TECHNICAL FIELD

The invention relates to an installation for treating a material, said installation having:
a) a treatment chamber which is equipped with an envelope which separates an atmosphere which is present inside the envelope from an atmosphere which is present outside said envelope, the atmosphere which is present inside the envelope being a controlled atmosphere;
b) a housing which delimits the treatment chamber;
c) at least one supporting roller, which is arranged at least partly inside the treatment chamber, for conveying the material;
d) one or more mounting apparatuses which are arranged outside the housing and by means of which the at least one supporting roller is mounted.

BACKGROUND OF THE INVENTION

From DE 10 2009 019 127 A1, an oven for manufacturing photovoltaic thin-film cells is known which has: an oven housing, the wall of which comprises an insulating layer; a gas-tight envelope which surrounds the oven housing and in the interior space of which a controlled atmosphere is present; and a conveyor system which comprises a plurality of supporting rollers and by means of which substrate plates can be conveyed through the oven housing; those end regions of the supporting rollers which are connected to the driving apparatus being mounted in a mounting apparatus, which mounting apparatus comprises at least one mounting pedestal which is carried by a profiled metal sheet which stands on a strut belonging to a steel structure connected to the oven housing.

The installation described in DE 10 2011 116 136 A1 for treating workpieces, in particular for treating substrates for photovoltaic thin-film cells, has a housing which delimits a treatment chamber in which a controlled atmosphere is present, it being possible for workpieces to be conveyed through said treatment chamber by a conveyor system having a plurality of supporting rollers, said supporting rollers being mounted externally on the side wall of the housing.

In known installations, the supporting rollers, in particular, and the mounting apparatuses for said supporting rollers are subjected to relatively high wear.

SUMMARY OF THE INVENTION

An object of the present invention is to make available an installation for treating a material, which installation is developed further, compared to the prior art, for example as regards disadvantages connected with the wear which has been mentioned.

This object may be achieved, in the case of an installation of the kind initially mentioned, through the fact that:

e) a flexible compensating element is provided between at least one mounting apparatus and a wall of the housing associated with said mounting apparatus;
f) a sealing arrangement connected to the compensating element is provided, which separates the at least one mounting apparatus from the atmosphere which is present inside the envelope.

In this way, the thermal loading on the mounting apparatus is reduced and its durability increased. Downtimes of the installation which occur as a result of wear-induced changes of bearings can be reduced according to the invention. Since it is possible to dispense with direct fixing of the mounting apparatus to the housing of the installation, the arrangement according to the invention permits simpler mounting and demounting of the transporting rollers.

The compensating element may preferably be constructed in such a way that the at least one mounting apparatus is decoupled from the wall of the housing as regards the supporting function for the supporting roller. The wall of the housing, for example a side wall of the oven, can thus be of a less complicated design and be produced more cost-effectively, for example because of more generous manufacturing tolerances.

It may be advantageous to arrange the compensating element in a pretensioned manner in such a way that the sealing arrangement is pressed towards the at least one mounting apparatus. This permits automatic adjustment of the sealing arrangement, which makes it possible to compensate for wear and rotational inaccuracies.

In an expedient configuration, the housing may have one or more passages which are each associated with a mounting apparatus, the compensating element being arranged in such a way, between the at least one mounting apparatus and that wall of the housing which is associated with the said at least one mounting apparatus, that sealing is guaranteed by the compensating element in spite of an offset that exists between the axis of the supporting roller and the axis of the passage for said supporting roller. In this way, misalignments of the passages in the housing can be compensated for with the aid of the compensating element. It is thus possible to reduce wear, in particular wear caused by tilting of the supporting roller.

The sealing arrangement may preferably have a receiving element which is constructed substantially in the form of a washer and which extends substantially within a plane perpendicular to the axis of rotation of the supporting roller. The provision of a receiving element constructed in this way may be favourable, precisely when used for an installation which is designed for protective gas operation at excess pressure.

It may, for example, be advantageous, for the purpose of applying barrier gas, if the sealing arrangement has a sealing element which is arranged between the compensating element and the receiving element of the sealing arrangement. In this case, the receiving element may be provided with a groove for receiving the sealing element.

An arrangement which is particularly safe, from the operating point of view, may be made available if the receiving element of the sealing arrangement is constructed in such a way that it moves, during a movement of the supporting roller, particularly during a rotational movement of said supporting roller when conveying the material, in kinematic coupling with the supporting roller.

The compensating element may advantageously be constructed substantially in the form of a tube within which a partial region of the supporting roller is arranged. In this way, particularly simple changing of said supporting roller is made possible.

In a further advantageous configuration, the compensating element may be a corrugated tube.

The envelope of the treatment chamber, the at least one compensating element and the at least one sealing arrangement may preferably delimit an atmospheric region in which the controlled atmosphere of the interior of the envelope is present.

Furthermore, it may be expedient that the envelope, the at least one compensating element and the at least one sealing arrangement are of gas-tight construction.

At least a predominant part of the compensating element may preferably be arranged outside the housing. In this case it is advantageous, in particular, that both the compensating element and the sealing arrangement can be easily checked with respect to condition and functioning.

In the case of cramped spatial specifications, for example, it may be expedient if at least part of the compensating element is arranged within a passage in the housing. In this way, a particularly compact form of embodiment of the installation is made possible.

In a further configuration, the supporting roller has a roller body and a roller spindle, said roller body and roller spindle being connected to one another in a form-locking manner. In this way it is possible to improve the ease of maintenance of the installation. This makes it easier to change the supporting roller.

The supporting roller preferably extends perpendicularly to two side walls of the housing, there being arranged, on the far side of the two side walls and at a distance from said two side walls in each case, a mounting apparatus with an accompanying compensating element and an accompanying sealing arrangement, the supporting roller being mounted in the two mounting apparatuses. In this way, the two mounting apparatuses are subjected to less thermal loading. The longevity of the mounting apparatuses is increased. Furthermore, it is possible, for example, to prevent the bearings of the mounting apparatuses, which bearings are often provided with bearing grease, from coming into contact with an atmosphere which exhibits comparatively high temperatures.

It is to be understood that the aspects and objects of the present invention described above may be combinable and that other advantages and aspects of the present invention will become apparent upon reading the following description of the drawings and detailed description of the invention.

BRIEF DESCRIPTION OF THE DRAWINGS

Further advantageous configurations emerge from the description that follows. In the latter, examples of embodiment of the invention will be explained in greater detail, without being restricted to these, with the aid of the drawings. The figures show, in a simplified, diagrammatic representation in each case, the following:

FIG. 5 another example of the invention in a view corresponding to FIG. 3;

FIG. 6 another example of the invention in a view corresponding to FIG. 3; and

DETAILED DESCRIPTION OF THE PRESENT INVENTION

Figure 1:
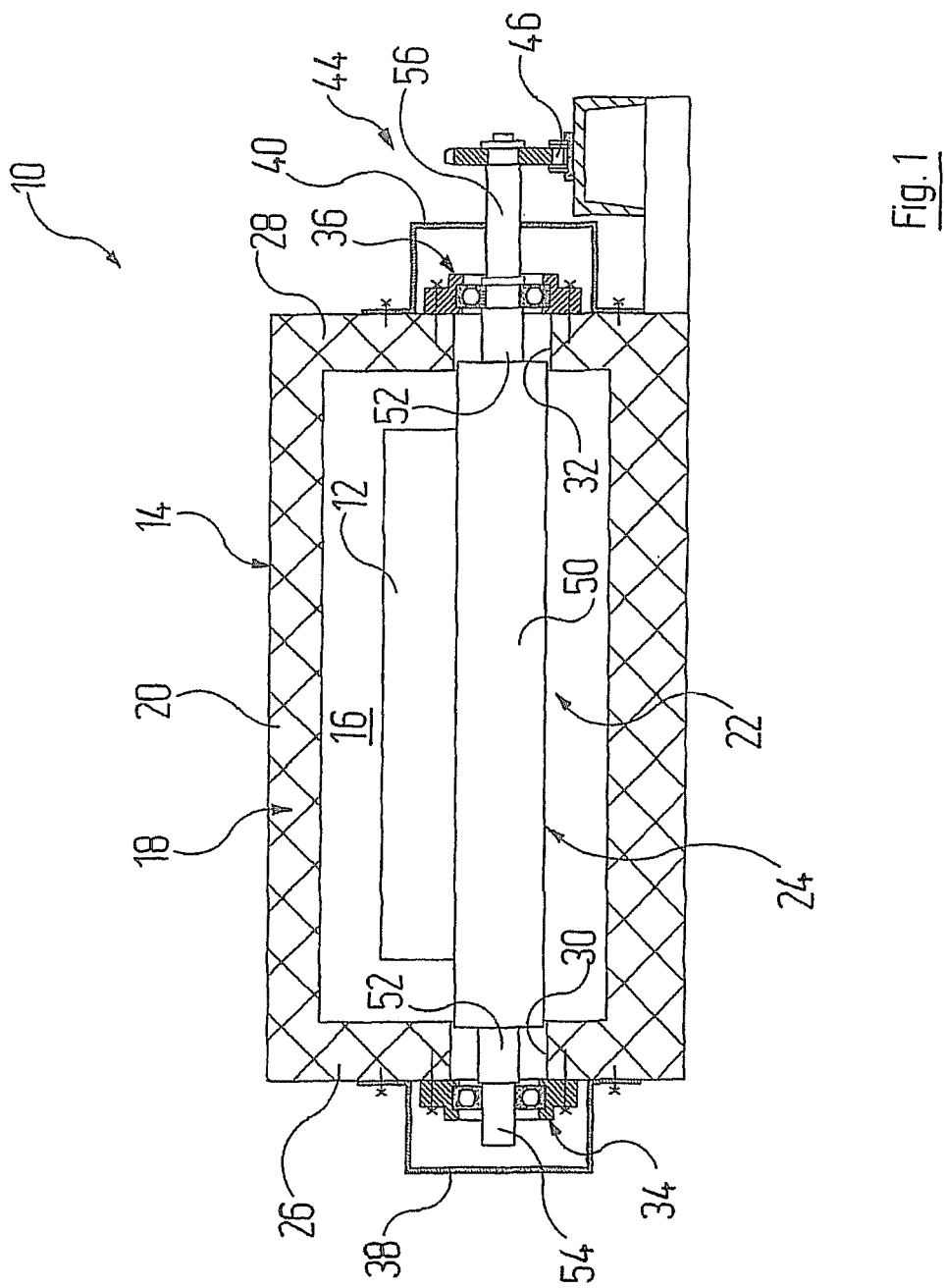
FIG. 1 a vertical section through an installation for treating a material, with an oven, which is known per se, according to the prior art.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

FIGS. 1 to 7 show, in different configurations, an oven, which is provided, as a whole, with the reference numeral 10, as an example of an installation for treating a material.

Installations for treating a material may constitute, for example, installations for hardening, firing and/or sintering, heating or drying materials. These materials may constitute, for example, ceramics for photovoltaics, technical ceramics, electrodes or electronic components as well as sheet-metals for so-called "hot-stamping" or composite materials.

As an example of a material which is treated in a treatment chamber 16 belonging to the installation, FIGS. 1 to 6 show a workpiece 12 which is indicated in the drawings as a substrate in the form of a substrate plate for photovoltaic thin-film cells. In such photovoltaic thin-film cells, use may be made of amorphous semi-conductor films which may be less than ten microns thick. The workpieces 12, for example substrates for photovoltaic thin-film cells, may be treated in the oven 10, for example in a preferably continuous run-through process. However, a cyclically operated oven is also possible.

By means of apparatuses of which no further details are represented, it is possible to introduce into the oven 10, or to produce within the oven 10, substances which are to be applied to the workpieces 12 which are moved through said oven 10. It is also possible to carry out, within an oven 10, pure thermal processes without the application of material, such as, for example, annealing processes.

Installations for treating a material, such as are shown by way of example in FIGS. 1 to 6, may be used when a material is to be treated in a treatment chamber 16 belonging to the installation in a controlled atmosphere that differs from the normal atmosphere. A controlled atmosphere of this kind exhibits parameters which are adapted to physical and/or chemical operations which take place within said treatment chamber 16. A controlled atmosphere may be, for example, an atmosphere having a pressure which is altered, compared with the normal pressure, and/or an atmosphere having a special gas, in particular a protective gas or an inert gas. Photovoltaic cells, for example, are manufactured in a controlled atmosphere. In the oven 10 shown, there may be present, for example, a special atmosphere having comparatively high temperatures which may lie, for example, above 600° C.

In order to produce a controlled atmosphere which is desired inside the oven 10, the ovens 10 shown in the figures by way of example may have other apparatuses, of which no further details are represented, such as, for example, vacuum pumps or lines via which a protective gas is fed in.

The workpieces 12 to be treated are moved through the treatment chamber 16 with the aid of a conveyor system 22. The figures each show, by way of example, a roller belonging to the conveyor system 22 which is constructed as a supporting roller 24.

As a rule, a conveyor system 22 having a supporting roller 24 such as is shown in FIGS. 1 to 6 comprises a plurality of supporting rollers 24 which are arranged parallel to one another and at a distance from one another and which are made of a suitable, temperature-resistant material. As the material for the supporting rollers 24, use may be made, for example, of ceramics, steel and/or silicon carbide, or optionally even a silicon-carbide ceramic composite. A run-through oven in which a material to be heated is moved through said oven 10 by means of supporting rollers 24, is also described as a "roller oven".

FIGS. 1 to 6 each show, by way of example, a driving device 44 for the supporting roller 24, which device may be equipped with a chain 46. This chain 46 may be constructed, for example, as a continuous chain and be provided in a driving mechanism such as is described, for example, in DE 693 34 189 T2. The supporting roller 24 may also be coupled to a driving device of a different kind, of which no further details are represented in the figures. Thus, for example, an electric geared motor may be provided as the source of drive for such a driving device of a different kind, in which case said electric geared motor is coupled to the supporting roller 24 with the aid of a shaft arrangement. A shaft arrangement of this kind may be configured, for example, in a manner similar to the shaft arrangement described in DE 10 2009 019 127 A1, in which case said shaft arrangement may preferably have a master shaft. In another alternative configuration, it is possible, for example, for one or more supporting rollers 24 belonging to an installation for treating a material to be provided without a corresponding driving device. Alternatively or in addition, it is possible to equip one or more supporting rollers 24 with a direct drive in each case.

FIG. 1 shows an oven which is provided, as a whole, with the reference numeral 10 and which will be described below as an example of an installation, which is known per se, for treating a material.

The oven 10 has a housing 14 which delimits a treatment chamber 16, said housing 14 comprising a layer with an insulating material 18 and a gas-tight envelope 20. In the example, the layer with the insulating material 18 is arranged on the inside of the envelope 20. Mineral wool, for example, may be used as the material for the insulating layer.

The controlled atmosphere which has been mentioned above prevails within the treatment chamber 16 of the installation which is constructed as an oven. The controlled atmosphere of the treatment chamber 16 is separated by the gas-tight envelope 20 from the atmosphere which is present outside said envelope 20, it being possible for said envelope 20 to be produced, for example, from sheet metal. Passages 30 and 32 for the supporting roller 24 are provided in the side walls 26 and 28 respectively.

The supporting roller 24, which is shown in FIG. 1, of the conveyor system 22 has a roller body 50 and a roller spindle 52, said roller spindle 52 passing through the passages 30, 32 in the side walls 26, 28 of the housing 14. Arranged outside the housing 14 on the side walls 26, 28 on either side of said housing 14 are mounting apparatuses, 34 and 36 respectively, for the supporting roller 24. These mounting apparatuses 34 and 36 are connected to the side walls, 26 and 28 respectively, of the housing 14 and secured to said side walls. An example of the way in which the mounting apparatuses 34, 36 are fixed to the side walls 26 and 28 respectively is indicated in FIG. 1.

The roller spindle 52 of the supporting roller 24 is mounted at both ends, in regions which protrude outwards beyond the side walls 26, 28 of the housing 14, in the mounting apparatuses 34 and 36. The passages 30 and 32 arranged in the side walls, 26 and 28 respectively, for the supporting roller 24 are not of gas-tight design. The mounting apparatuses 34, 36 for the rotary spindle 52 of the supporting roller 24 are likewise not of gas-tight construction.

On a first side of the housing 14, a first end region 54 of the rotary spindle 52 and the associated mounting apparatuses 34 are surrounded, on the far side of the side wall 26, by a housing part 38 of the envelope 20.

On a second side of the housing 14 that lies opposite the first side, a second end region 56 of the rotary spindle 52 is coupled to the driving device 44 which has already been mentioned. According to FIG. 1, on the second side of the oven 10, at least part of the second end region 56 of the rotary spindle 52 and the associated mounting apparatuses 36 are surrounded, on the far side of the side wall 28, by a housing part 40 of the envelope 20. The housing parts 38, 40 of the envelope 20 are constructed in such a way that the most gas-tight separation possible is brought about between the external atmosphere and the controlled atmosphere prevailing in the interior of said envelope 20. In the example shown in FIG. 1, part of the second end region 56 of the rotary spindle 52 passes out of the housing part 40 of the envelope 20 and is preferably connected, at the end, to the driving device 44.

In a manner corresponding to the arrangement shown in FIG. 1, which corresponds, per se, to the prior art, the mounting apparatuses 34, 36 for the supporting roller 24 are located within the controlled atmosphere prevailing in the interior of the envelope 20, under which circumstances the mounting apparatuses 34, 36 are exposed to high thermal loading.

As already mentioned, the mounting apparatuses 34 and 36 are fixed, in embodiments of an oven 10 which correspond to the prior art, as indicated in FIG. 1, to the side walls, 26 and 28 respectively, of the housing 14. As a result of this, unwanted tilting of the supporting roller 24 can occur because of misalignments, which cannot always be avoided in practice, of the passages 30, 32 in the side walls, 26 and 28 respectively, of the housing 14. Such misalignments of the passages 30, 32 can occur, for example, because of inaccuracies in the construction of the openings in the oven. Tilting of the roller can cause it to wear away in a non-uniform manner and can increase the wear on the supporting roller 24 or the wear on the mounting apparatuses 34 and 36 for said supporting roller 24.

The oven 10 shown in FIG. 1 is similar, in its basic makeup, to ovens such as are described, for example, in DE 10 2009 019 127 and DE 10 2011 116 136 A1, the reader being referred, for further information, to these published specifications.

With the aid of FIGS. 2 to 6, various examples of the present invention will be described below, in which an oven, which is provided, as a whole, with the reference numeral 10, will be described as an example of an installation for treating a material. Here, a workpiece 12 is treated in the treatment chamber 16, which is surrounded by a housing 14, of the oven 10, under which circumstances a thermal treatment, in particular, may take place within the oven 10. According to the examples shown in FIGS. 2 to 6, the housing 14 has an insulating layer made of an insulating material 18 and an outer envelope 20. The envelope 20 of the oven 10 is, at least to a very great extent, of gas-tight construction, and separates the controlled atmosphere in the treatment chamber 16 of the installation from the surrounding atmosphere.

Figure 2:
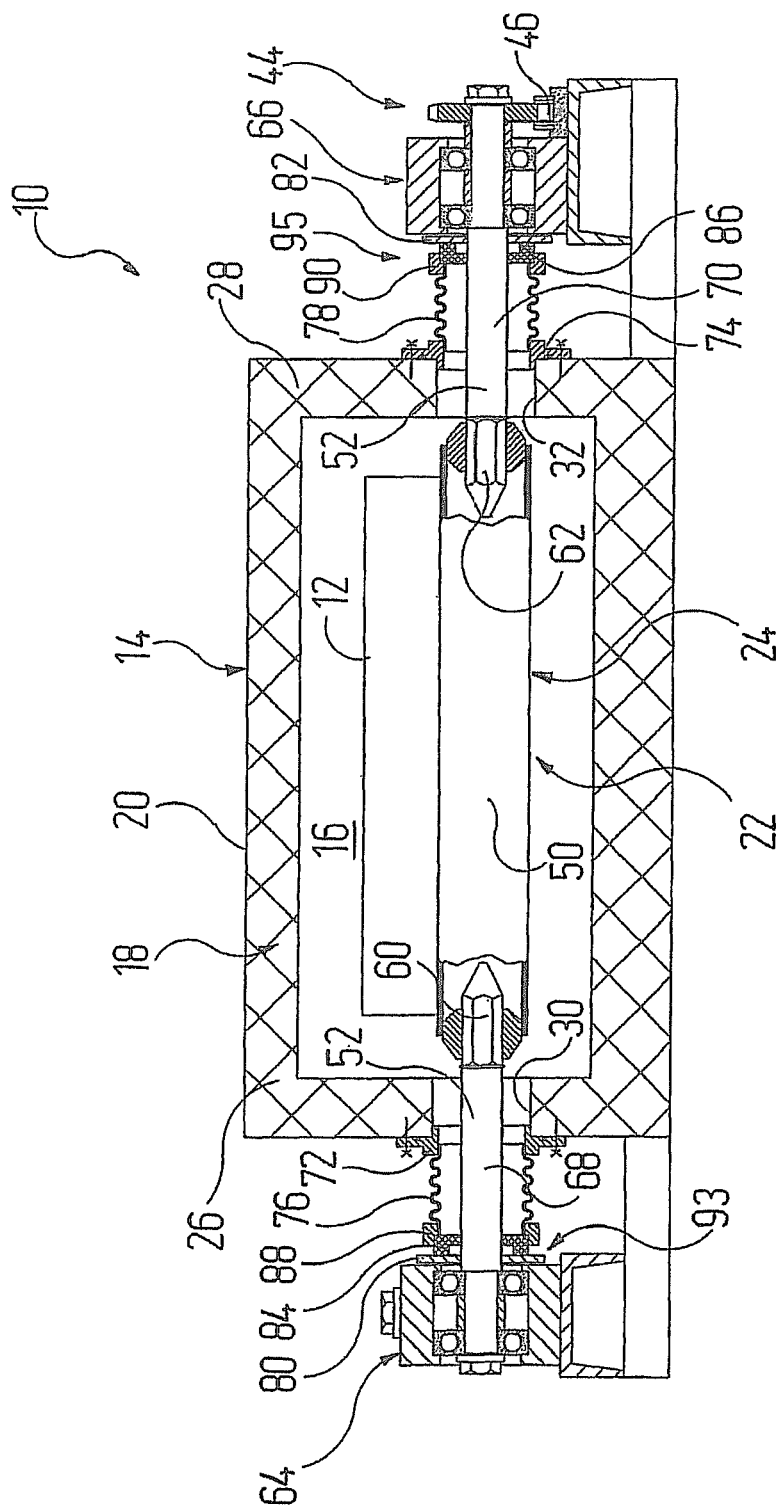
FIG. 2 a vertical section through an installation for treating a material, according to an example of the present invention.

As indicated in FIG. 2, a conveyor system 22 having one or more supporting rollers 24 for the workpieces 12 to be treated is provided in the treatment chamber 16. The supporting roller 24 shown in FIGS. 2 to 6 is constructed for the purpose of moving the workpiece 12 through the treatment chamber 16, and is coupled to the driving device 44 already mentioned.

The housing 14 of the oven 10 has a number of walls. Walls of said housing 14 constitute, for example, a ceiling, which is not provided with reference numerals, and the side walls 26, 28.

Mounting apparatuses 64, 66 for the supporting roller 24 are provided outside the housing 14, said mounting apparatuses 64, 66 being arranged at a distance from the side walls 26, 28 of said housing 14. Mounting apparatuses 64, 66 of this kind may be constructed, for example, as conventional supporting and rotary bearings, for example in the form of a rolling bearing or sliding bearing. The supporting roller 24 is mounted in the mounting apparatuses 64, 66.

The supporting roller 24 which is shown by way of example in FIGS. 2 to 6 has a roller body 50 and a roller spindle 52. In the examples shown, the roller spindle 52 protrudes beyond the roller body 50. Said roller body 50 and roller spindle 52 are preferably connected to one another in a form-locking manner. A lateral axial section 70 of the roller spindle 52 extends from the roller body 50 towards the mounting apparatus 66.

FIG. 2 shows a configuration of the supporting roller 24 in which the roller spindle 52 is of multipart construction, the roller body 50 connecting two axial sections 68, 70 of said roller spindle 52. In the example shown, the roller body 50 is slipped onto the roller spindle 52, the two axial sections 68, 70 being provided with polygonal shafts, 60 and 62 respectively. In the example shown, the polygonal shafts 60, 62 are each constructed as a hexagon. In the example shown, the diameter of the roller spindle 52 is smaller than the diameter of the roller body 50. In a different configuration of the supporting roller 24 which is not shown in the figures, the diameter of the roller body 50 may be smaller than the diameter of the roller spindle 52. Other different configurations of the form-locking connection between the roller spindle 52 and the roller body 50 are possible.

According to the examples shown in FIGS. 2 to 6, a side wall 28 of the housing 14 of the oven 10, which side wall faces towards the mounting apparatus 66, is provided with a passage 32 for the supporting roller 24. The supporting roller 24 shown in FIG. 2 extends through passages 30, 32 in the housing 14 of the oven 10 and is arranged partly inside and partly outside said housing 14.

In the examples in FIGS. 2 to 6, a flexible compensating element 78 is provided between the mounting apparatus 66 and the side wall 28 which is associated with said mounting apparatus 66. A partial region of the supporting roller 24 is arranged in the compensating element 78, or extends through said compensating element 78 which is preferably at least substantially of tubular construction. In this way, easy changing of individual oven rollers, for example the supporting rollers 24 of a conveyor system 22 (see FIG. 2), is possible. The distances between rollers in a conveyor system 22 may, for example, be approximately equal to, or greater than, 75 mm.

The compensating element 78 may be arranged in a pretensioned manner in such a way that the sealing arrangement 95 is pressed towards the at least one mounting apparatus 66. In this way, automatic adjustment by means of the compensating element 78 may take place in such a way that wear and rotational inaccuracies are compensated for. Under these circumstances, it is preferably possible to adjust the force which is acting upon the sealing arrangement 95. In the examples in FIGS. 2 to 6, the flexible compensating element is constructed as a corrugated tube. As a result of its spring action, the corrugated tube 78 is able to at least partly compensate for wearing-away of the sealing arrangement 95. Basically, the flexibility of the compensating element 78 or its elasticity can be defined, for example, by the choice of material, structure and/or geometry.

A sealing arrangement 95 which is connected to the compensating element 78 is also provided in the examples in FIGS. 2 to 6. This sealing arrangement 95 separates the mounting apparatus 66 from the atmosphere which is present inside the envelope 20 or within the housing 14 of the oven 10. For this purpose, the sealing arrangement 95 preferably has a receiving element which is constructed substantially in the form of a washer and which extends substantially within a plane perpendicular to the axis of rotation of the supporting roller 24.

A fastening flange 74 which effects sealing is provided on the side, which faces towards the housing 14, of the compensating element 78 which is constructed, for example, as a corrugated tube 78, said fastening flange 74 being arranged, according to FIG. 2, between the corrugated tube 78 and the side wall 28, and part of the fastening flange 74 extending into the passage 32.

The configurations, which are shown in the examples in FIGS. 2 to 6, of a sealing system for the roller feed-through are suitable for an oven 10 which is operating with protective gas at excess pressure. Under these circumstances, the envelope 20 of the treatment chamber 16 delimits, together with the compensating element 78 and the sealing arrangement 95 and with the inclusion of the fastening flange 74 and the sealing element 96 respectively, an atmospheric region within which the controlled atmosphere of the interior of the envelope is present. Under these circumstances, the boundaries of this atmospheric region, or the elements of the boundary, are preferably of gas-tight construction.

FIG. 2 shows a sealing arrangement 95 having a sealing element 86 and having a thrust washer 82 as a receiving element for said sealing element 86. The thrust washer 82 is kinematically coupled to the supporting roller 24 and rotates with said supporting roller 24 when the latter rotates, under which circumstances the thrust washer 82 may be, for example, welded to the roller spindle 52. The sealing element 86, too, may be of annular construction and rubs against the thrust washer 82 and against the roller spindle 52 when a movement of the supporting roller 24 occurs. The sealing element 86 is arranged between the thrust washer 82 and the corrugated tube 78, an end region of said corrugated tube 78 and part of the sealing element 86 being encompassed by an annular element 90 of the sealing arrangement 95.

FIG. 2 shows, diagrammatically and by way of example, an oven 10 in which, on the far side of the two side walls 26, 28 of the oven 10, a mounting apparatus 64, 66 is arranged in each case, outside the housing 14 and at a distance from said side walls 26, 28. Under these circumstances there are provided, on either side of the housing 14, a compensating element 76, 78, which is constructed, for example, as a corrugated tube, and a sealing arrangement 93, 95 which is connected to said compensating element 76, 78. A partial region of the axial sections 68, 70 of the roller spindle 52 of the supporting roller 24 extends, in each case, through the corrugated tube, 76 and 78 respectively, provided on the corresponding side of the housing. Provided on either side of said housing 14, between the respective corrugated tube 76, 78 and the corresponding passage 30, 32 in the side wall 26, 28, is a seal which is preferably gas-tight and which may be constructed, for example, as a fastening flange, 72 and 74 respectively. According to the example shown in FIG. 2, the sealing arrangement 93, 95 has, on either side, a thrust washer 80, 82 which screens off the associated mounting apparatus 64, 66 in each case and which is connected, with the aid of at least one sealing element 84, 86, to the corrugated tube 76, 78, there also being provided an annular element 88, 90 which encloses an end region of the corrugated tube 76, 78 and at least part of the sealing element 84, 86.

In this way it is possible to separate the functions of mounting the supporting roller 24 and sealing the treatment chamber 16 from one another, a fact which permits safer operation of the installation, particularly in the event of very high temperatures in the region of the passages 30, 32 for said supporting roller 24. The mounting apparatuses 64, 66 are decoupled from the housing 14 of the oven 10 as regards the supporting function for the supporting roller 24.

Figure 3:
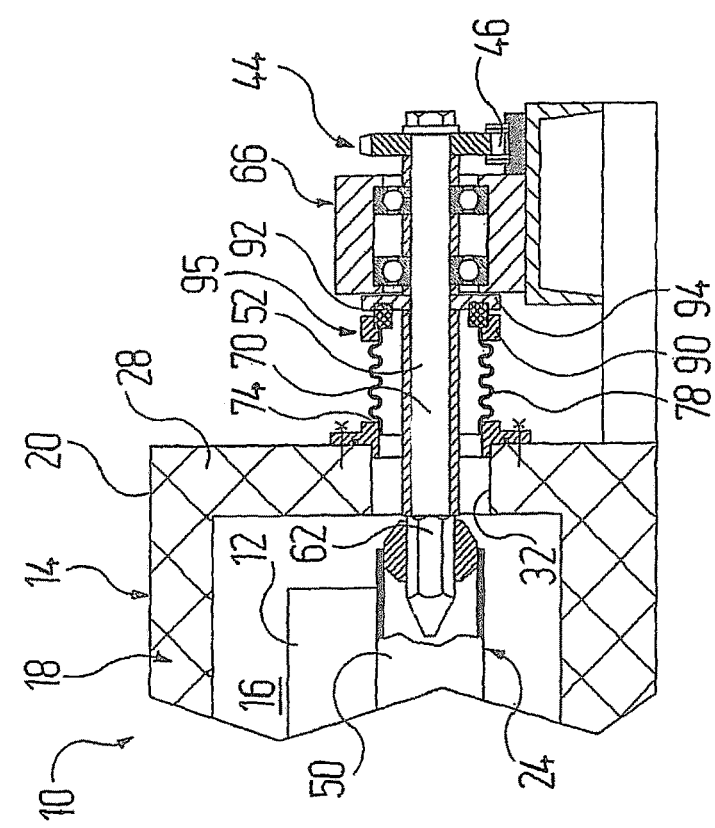
FIG. 3 a vertical section, in a detailed enlargement, through an installation for treating a material, according to another example of the present invention.

FIG. 3 shows an oven 10 in which the roller body 50 of the supporting roller 24 is shorter than the internal width of said oven 10. The roller spindle 52 is connected to the roller body 50 via a polygonal shaft 62 for form-locking driving purposes. The sealing arrangement 95 shown in FIG. 3 has a thrust washer 94 which is equipped with a groove for receiving the sealing element which, in the example shown, is constructed as a sealing ring 92. In addition, the sealing arrangement 95 has a further annular element 90 which is arranged radially outside the sealing ring 92 and the corrugated tube 78. The thrust washer 94 may be attached to the roller spindle 52 in a clamped manner, under which circumstances use may be made, for example, of washers and/or bushes.

Figure 4:
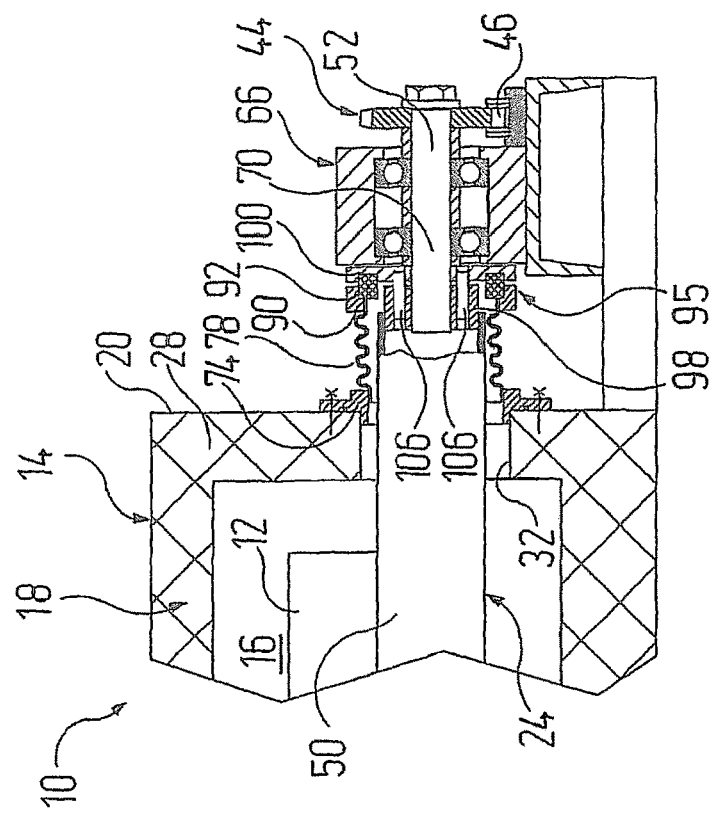
FIG. 4 another example of the invention in a view corresponding to FIG. 3.

The roller body 50 of the supporting roller 24 of the oven 10 shown in FIG. 4 is longer than the internal width of said oven 10. In this case, the roller body 50 protrudes into the compensating element 78 which, in the example, is constructed as a corrugated tube. The thrust washer 100, which is shown in FIG. 4, of the sealing arrangement 95 has a number of driver pins 106 which protrude into the supporting roller 24. For this purpose, the bottom 98 of the roller body 50 may be provided, for example, with bores for receiving the driver pins 106. The thrust washer 100 also has a groove for receiving the sealing ring 92 of the sealing arrangement 95, a further annular element 90 being provided, which encompasses part of the sealing ring 92 and part of the corrugated tube 78.

In FIG. 4, an offset can be seen between the axis of the supporting roller 24 and the axis of the passage 32 provided for said supporting roller 24 in the side wall 28. This offset can be compensated for by the compensating element 78. In the example shown, the corrugated tube 78 is accordingly oriented in a manner deviating from a horizontal axis, said corrugated tube 78 being oriented in a manner rising from the wall of the housing 14 towards the mounting apparatus 66. As a result of the flexible orientation of the compensating element 78 constructed as a corrugated tube, sealing is guaranteed in spite of an offset that exists between the axis of the supporting roller 24 and the axis of the passage 32.

According to the examples shown in FIGS. 2 to 4, the compensating element 78 is arranged outside the housing 14. Under these circumstances, the fastening flange 74 provided between the corrugated tube 78 and the side wall 28 is preferably arranged, for the most part, outside the passage 32.

According to the examples shown in FIGS. 5 and 6, at least part of the compensating element 78 is arranged within the passage 32 in the housing 14. This permits a more compact structural shape for the arrangement encompassing the supporting roller 24. In the two examples shown, there is provided on the side wall 28, in this case, a sealing element 96 which is arranged between the compensating element 78 constructed as a corrugated tube 78 and the side wall 28, said sealing element 96 being drawn into the opening 32 in said side wall 28 or preferably being arranged, in the case of a substantial part thereof, inside said passage 32.

The sealing arrangements 95 shown in FIGS. 5 and 6 have, in a manner similar to the sealing arrangements 95 already described above, a sealing ring 92, an outer annular element and a thrust washer 94 having a groove for receiving said sealing ring 92. According to FIG. 5, the roller spindle 52 of the supporting roller 24 is connected to the roller body 54 in a form-locking manner by means of a polygonal shaft 62.

According to FIG. 6, the roller spindle 52 of the supporting roller 24 is provided with a collar 104. In this case, the roller spindle is connected to the roller body 54 via drivers 102 arranged, for example, on said collar 104. In the example shown, said drivers 102 are of pin-shaped construction and protrude into the bottom 98 of the roller body 54. Such a configuration may be advantageous, in particular, for large rollers. In this case, the diameter of the passage 32 and the diameter of the corrugated tube 78 are, as a rule, coordinated with the size of the supporting roller 24 used.

The exemplary configurations of the invention explained with the aid of FIGS. 2 to 6 are suitable for an installation having very high temperatures within the treatment chamber 16, it being possible to adapt the choice of material and the design to the specific conditions of use. One of the advantages of these configurations lies in the fact that, in particular, the sealing surfaces that are essential to operation are arranged in a more easily accessible manner and can thus be checked with respect to condition and functioning in a relatively simple manner. A further advantage lies in the fact that the bearings of the mounting apparatuses 64, 66 are better protected from the high temperatures mentioned.

An idea which underlies the invention can be summarised as follows: The present invention relates to an installation, which is constructed, for example, as a roller oven, for treating a material, said installation having: a treatment chamber 16 which is equipped with an envelope 20 which separates an atmosphere which is present in its interior from an atmosphere which is present outside said envelope 20, the atmosphere which is present inside the envelope 20 being a controlled atmosphere; a housing 14 which has walls and delimits the treatment chamber 16; at least one supporting roller 24, which is arranged at least partly inside the treatment chamber 16, for conveying the material; and one or more mounting apparatuses 64, 66 which are arranged outside the walls of the housing 14 and in which the at least one supporting roller 24 is mounted, a flexible compensating element 78 being provided between at least one mounting apparatus 64, 66 and a wall, which is associated with the latter, of the housing 14, and there being provided a sealing arrangement 93, 95 which is connected to said compensating element 78 and which separates the at least one mounting apparatus 64, 66 from the atmosphere which is present inside the envelope 20. In this way it is possible to lessen the loading on the mounting apparatuses 64, 66 and to increase their longevity.

By dispensing with fixing the mounting apparatuses 64, 66 to the housing 14 of the installation, simplified mounting and demounting of the transporting rollers 24 may be made possible. Wear-induced downtimes of the installation are thus reduced.

Figure 7:
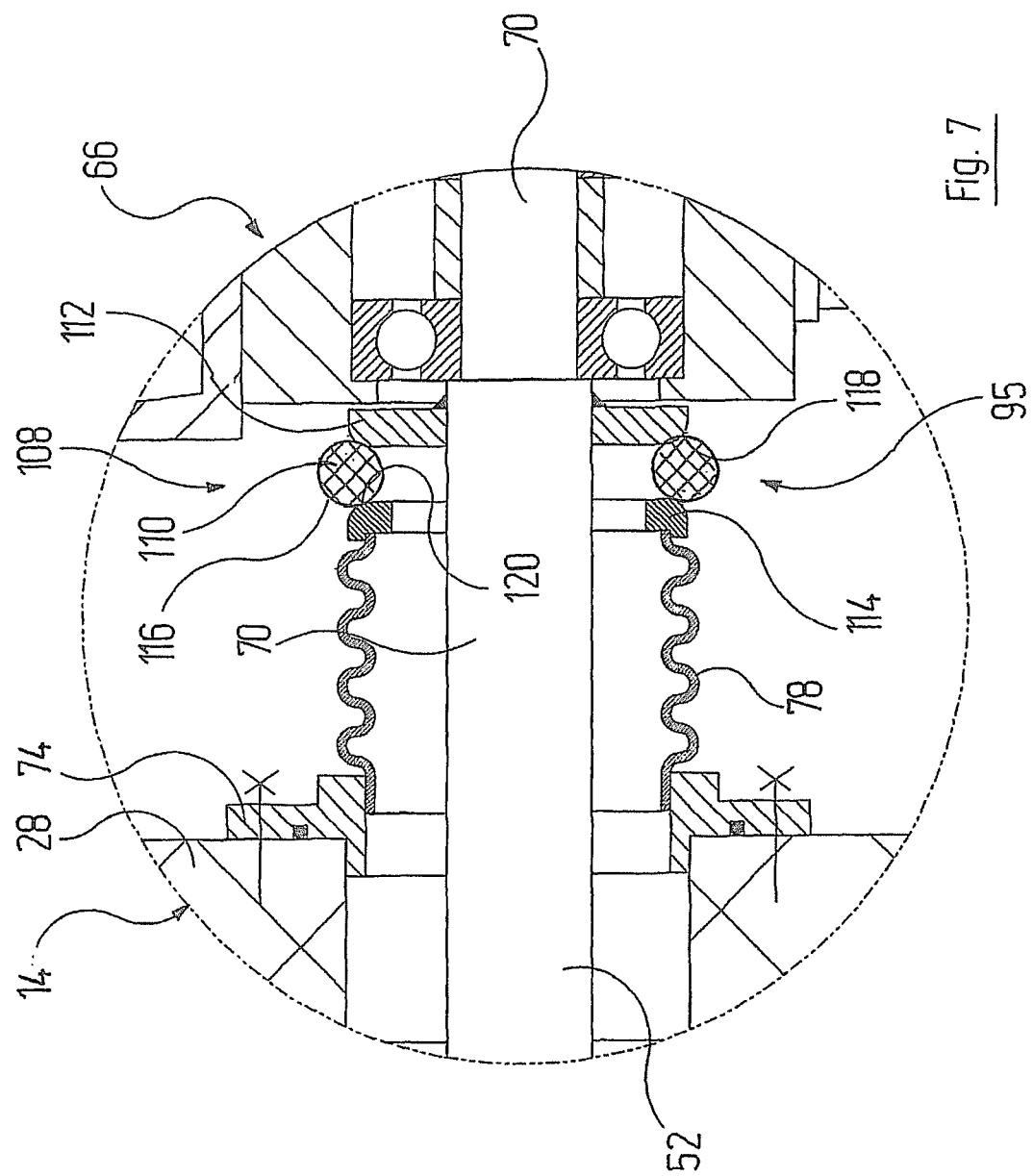
FIG. 7 a detailed enlargement of a modified sealing arrangement.

A modified sealing arrangement 95 is shown in a detailed enlargement in FIG. 7, in which components that have already been explained bear the same reference numerals.

There, the sealing arrangement 95 is constructed as a floating seal 108 in which a sealing ring 110 is arranged in a floating manner between a thrust washer 112 on the mounting apparatus 66 and an annular element 114 on the compensating element 78.

In the present example of embodiment, the sealing ring 110 has a circular cross-section and its outer superficies 116 lies in a sealing manner against a sealing face 118 of the thrust washer 112 and against a sealing face 120 of the annular element 114. For this purpose, these sealing faces 118 and 120 are curved and, in the present example of embodiment, extend, in cross-section, in the form of the arc of a circle.

The sealing ring 110 mounted in a floating manner ensures that sealing is maintained even when there is a change in position of the compensating element 78, since the components concerned are able to follow a change in position without the sealing contact, which is linear because of the curved surfaces 112, 118, 120, being interrupted.

In another modification, which is not actually shown, the sealing ring 110 may also have a cross-section that differs from a circle, in particular a rectangular or square cross-section. Because of the curved counter-surfaces 118, 120, sealing contact in relation to the thrust washer 112 and the annular element 114 is, even then, always guaranteed.

It is to be understood that additional embodiments of the present invention described herein may be contemplated by one of ordinary skill in the art and that the scope of the present invention is not limited to the embodiments disclosed. While specific embodiments of the present invention have been illustrated and described, numerous modifications come to mind without significantly departing from the spirit of the invention, and the scope of protection is only limited by the scope of the accompanying claims.

The invention claimed is:

1. An installation for treating a material comprising:
  a) a housing which delimits a treatment chamber, the housing comprising an envelope which separates an atmosphere which is present inside the envelope from an atmosphere which is present outside said envelope, wherein the atmosphere inside the envelope is a controlled atmosphere;
  b) at least one supporting roller, which is arranged at least partly inside the treatment chamber, for conveying a material;
  c) at least one mounting apparatus which is arranged outside the housing, the at least one mounting apparatus being associated with a wall of the housing, the at least one supporting roller being mounted by the at least one mounting apparatus;
  wherein
  d) a flexible compensating element is provided and extends between the at least one mounting apparatus and the wall of the housing associated with the at least one mounting apparatus,
    da) a flange connected to a first end of the flexible compensating element, and
    db) a second end of the flexible compensating element having a sealing arrangement connected thereto, the sealing arrangement extending between the second end of the flexible compensating element and the at least one mounting apparatus and separating the at least one mounting apparatus from the atmosphere which is present inside the envelope.

2. The installation according to claim 1, wherein the flexible compensating element is constructed in such a way that the at least one mounting apparatus is decoupled from the wall of the housing as regards the supporting function for the supporting roller.

3. The installation according to claim 1, wherein the flexible compensating element is elastic and arranged between the at least one mounting apparatus and the wall of the housing associated with the at least one mounting apparatus in a pretensioned manner so that the sealing arrangement is pressed towards the at least one mounting apparatus.

4. The installation according to claim 1, wherein the housing has one or more passages, each passage being associated with one of the one or more mounting apparatuses, and
  the flexible compensating element is elastic and arranged between the at least one mounting apparatus and the wall of the housing associated with the at least one mounting apparatus so that the flexible compensating element can bend to compensate for any offset which occurs between the axis of the supporting roller and an axis of the passage for the supporting roller, guaranteeing sealing of the controlled atmosphere in the passage associated with the at least one mounting apparatus.

5. The installation according to claim 1, wherein the sealing arrangement has a receiving element which is a washer and which extends within a plane perpendicular to the axis of rotation of the supporting roller.

6. The installation according to claim 1, wherein the sealing arrangement has a sealing element, which sealing element is arranged between the flexible compensating element and the receiving element of the sealing arrangement.

7. The installation according to claim 5, wherein the receiving element of the sealing arrangement is kinematically coupled to the supporting roller so that the receiving element rotates in conjunction with rotation of the support roller.

8. The installation according to claim 1, wherein the flexible compensating element is a tube within which a partial region of the supporting roller is arranged.

9. The installation according to claim 8, wherein the flexible compensating element is a corrugated tube.

10. The installation according to claim 1, wherein the controlled atmosphere is bounded entirely within an atmospheric region formed by the envelope, the flexible compensating element and the sealing arrangement.

11. The installation according to claim 10, wherein each of the envelope, the flexible compensating element and the sealing arrangement are of gas-tight construction.

12. The installation according to claim 1, wherein the flexible compensating element is arranged outside the housing.

13. The installation according to claim 1, wherein at least part of the flexible compensating element is arranged in a passage in the housing.

14. The installation according to claim 1, wherein the supporting roller has a roller body and a roller spindle, said roller body and roller spindle being connected to one another in a form-locking manner.

15. The installation according to claim 1, wherein the supporting roller extends through the treatment chamber perpendicularly between two interior side walls of the housing, each interior side wall having an associated exterior side wall, each exterior side wall having one of the one or more mounting apparatuses associated therewith, each mounting apparatus having an associated flexible compensating element with a sealing element connected thereto, each flexible compensating element extending between its associated mounting apparatus and the exterior wall associated with the mounting apparats,
   wherein the supporting roller is mounted to each mounting apparatus.

16. The installation according to claim 5, wherein the washer includes groove, the groove receiving a sealing ring.

17. The installation according to claim 16 further comprising an annular member, the annular member coupling the sealing ring and flexible compensating element.

18. The installation according to claim 1 wherein the wall of the housing associated with the at least on mounting apparatus partially delimits and bounds the treatment chamber.

19. An installation for treating a material comprising:

a) a housing which delimits a treatment chamber, the housing comprising an envelope which separates an atmosphere which is present inside the envelope from an atmosphere which is present outside the envelope, wherein the atmosphere inside the envelope is a controlled atmosphere;

b) at least one supporting roller for conveying a material, the at least one supporting roller being arranged at least partly inside the treatment chamber;

c) at least two mounting apparatuses which are arranged outside the housing, each of the at least two mounting apparatuses being associated with a wall of the housing, the at least one supporting roller being mounted by the at least two mounting apparatuses;

d) at least two flexible compensating elements, each flexible compensating element extending between an associated mounting apparatus from the at least two mounting apparatuses and the wall of the housing associated with the associated mounting apparatus, wherein a sealing arrangement is connected to each flexible compensating element, each sealing element being kinematically coupled to the at least one supporting roller so that each sealing arrangement moves during a movement of the supporting roller, each sealing element separating the associated mounting apparatus from the atmosphere which is present inside the envelope.

* * * * *